(12) United States Patent
Barmatz et al.

(10) Patent No.: US 6,391,396 B1
(45) Date of Patent: May 21, 2002

(54) CHEMICAL VAPOR DEPOSITION COATING OF FIBERS USING MICROWAVE APPLICATION

(75) Inventors: Martin B. Barmatz, Pasadena; Gordon Hoover, Tujunga; Henry W. Jackson, Laverne, all of CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/724,593

(22) Filed: Nov. 28, 2000

Related U.S. Application Data

(62) Division of application No. 09/320,189, filed on May 26, 1999, now Pat. No. 6,152,072.
(60) Provisional application No. 60/086,833, filed on May 16, 1998.

(51) Int. Cl.[7] ................................................. H05B 6/64
(52) U.S. Cl. ...................... 427/575; 427/255.5; 216/69; 219/678

(58) Field of Search ................................. 118/723 MW, 118/724, 722; 219/690, 691, 692, 693, 764, 695–97, 678; 427/575, 255.5; 216/69

(56) References Cited

U.S. PATENT DOCUMENTS

| | | | | |
|---|---|---|---|---|
| 5,129,359 A | * | 7/1992 | Takei et al. | 118/723 MW |
| 5,370,912 A | * | 12/1994 | Bigelow et al. | 427/575 |
| 5,442,160 A | * | 8/1995 | Kimrey, Jr. et al. | |
| 5,450,205 A | * | 9/1995 | Sawin et al. | 356/382 |
| 6,152,072 A | * | 11/2000 | Barmatz et al. | |

* cited by examiner

*Primary Examiner*—Timothy Meeks
(74) *Attorney, Agent, or Firm*—Fish & Richardson P.C.

(57) ABSTRACT

Chemical vapor deposition coating is carried out in a cylindrical cavity. The fibers are heated by a microwave source that is uses a TM0N0 mode, where O is an integer, and produces a field that depends substantially only on radius. The fibers are observed to determine their heating, and their position can be adjusted. Once the fibers are uniformly heated, a CVD reagent is added to process the fibers.

1 Claim, 1 Drawing Sheet

SECTION A-A'

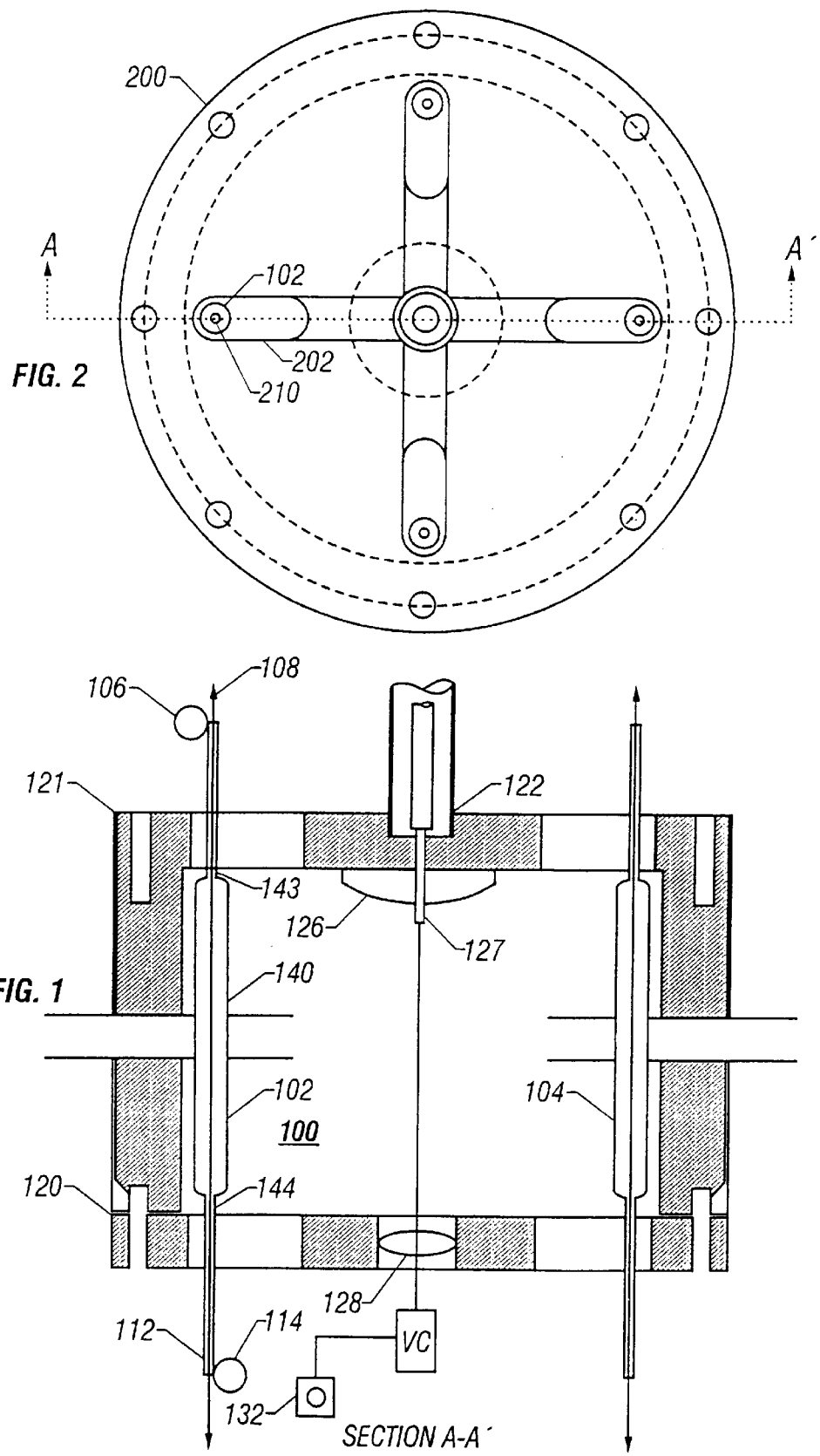

CHEMICAL VAPOR DEPOSITION COATING OF FIBERS USING MICROWAVE APPLICATION

This application is a divisional of U.S. application Ser. No. 09/320,189, filed May 26, 1999, now U.S. Pat. No. 6,152,072 which claims priority of U.S. application serial No. 60/086,833, filed May 16, 1998.

STATEMENT AS TO FEDERALLY SPONSORED RESEARCH

The invention described herein was made in the performance of work under a NASA contract, and is subject to the provisions of Public Law 96-517 (35 U.S.C. 202) in which the Contractor has elected to retain title.

BACKGROUND

Many different applications for coating of fibers are known. One way to coat a fiber is by chemical vapor deposition or "CVD".

Conventional coating of a fiber starts with a portion of the fiber called a core being heated by a direct electrical current through the fiber. The hot core is exposed to reagent vapor, to be coated by CVD. The core can be simultaneously spooled through a chamber containing reagent gases. The current is introduced into the chamber via mercury electrodes that also serve as gas seals for the ends of the reaction chamber. Each chamber can typically accommodate only a single fiber at a time.

Such a system has drawbacks. The toxic character of the mercury that is used in the electrodes becomes an environmental hazard. Moreover, many systems allow only a single fiber to be processed at a time. This can be expensive in terms of production costs. These systems also require that the fiber be at least a moderately good electrical conductor in order to achieve adequate heating for the CVD.

European Patent No. 055295181 describes coating fibers using CVD in a microwave heating of a waveguide applicator. This system operates without mercury and extends the range of fiber materials. However, this system is limited. For example, this system does not teach how to coat more than a single fiber at a time.

SUMMARY

The present system addresses this problem by coating fibers using CVD in a special, adjustable microwave cavity. The disclosed system uses CVD in a way that allows simultaneous processing of multiple fibers. This is done in a cylindrical resonant microwave cavity that is excited in a transverse magnetic (TM) mode, eg one which is essentially TM0N0, where n is a positive integer. The system can avoid using toxic metals such as mercury. Moreover, the cavity applicator includes multiple reaction chambers, one reaction chamber for each fiber. Each of the reaction chambers gets about the same amount of microwave energy along almost its entire length.

In preferred embodiments, the chambers are defined by a tube that is made of low-loss material such as quartz. A reagent gas flows therethrough to form the CVD coating when the fiber temperature is above some threshold value. Known techniques based on flowing gas are used to prevent air contamination in the reaction chamber. This also permits the fiber to move continuously through the chamber.

Fiber feed and take up can be provided by conventional spool and pulley arrangements or similar arrangements can be carried out where one or both pulleys are replaced by guide tubes as described herein. Further details are described in the following.

BRIEF DESCRIPTION OF THE DRAWINGS

These and other aspects of the invention will now be described with reference to the attached drawings, in which:

FIG. 1 shows a diagram of the chamber system; and

FIG. 2 shows a cross section of the chamber along the line A–A1.

DESCRIPTION OF THE PREFERRED EMBODIMENT

The preferred embodiment is shown in FIG. 1 with a cross section along the line A–A1 being shown in FIG. 2. The system of FIG. 1 enables economically and efficiently heating and coating fibers using chemical vapor deposition in a resonant microwave cavity applicator. This applicator is excited in a mode that is essentially TM0N0. The fibers are positioned to cause only small deviations from the empty cavity normal mode electromagnetic field distribution. At the same time, these fibers absorb a large fraction of the power that is transmitted into the cavity.

As explained herein, this positioning becomes critical for fibers that have highly lossy cores, such as carbon, or other materials.

The TM0N0 mode is a resonant mode that provides symmetry The electric field distribution for a TM0N0 mode varies substantially only in the radial direction. This feature promotes uniformity of processing along the length of the fiber and also simplifies the selection of optimum locations for uniformity. Each of the fibers is preferably located near a radial electric field node. In this embodiment, the electric field intensity is maximum on the axis and substantially zero at the cavity wall. The electrical field vector is parallel to the axis throughout the cavity for each TM0N0 mode.

Whenever N is greater than 1, one or more electric field nodal cylindrical surfaces will be located away from the curved walls of the cavity. This enables using additional multiple nodes to simultaneously coat multiple fibers.

An embodiment is shown in FIG. 1. This embodiment is used to preferentially apply a coating, preferably a silicon carbide coating, to any desired number of fibers simultaneously. Each of the fibers is at a symmetrical radial location. This system uses a resonant microwave cavity 100 which operates in the TM010 mode. Each fiber is located within a housing portion 102, 104. Each housing portion is supplied with gas reagent which allows CVD to be carried out when reaching the right temperature. Each housing portion 102 is attached to a pulley feed spool 106, which feeds the fiber 108 through the processing apparatus. The opposite end of the device is connected to aspirator 112 to suck out the reagent, and to a take up spool 114. The preferred fiber has cores formed of carbon with diameters of approximately 30 μm. The processed fibers have outer diameters of about 130 μm. The cavity is excited by a traveling wave tube ("TWT") 120 connected to a "N" type connector 122 which excites the TM010 mode in the cavity at a frequency of approximately 2.45 gigahertz with about 300 watts of power. The cavity has a length of about 7½ centimeters from the top portion 121 to the bottom portion 122.

The TWT 120 is connected to a coaxial transmission line that in turn is connected to an electric rod dipole antenna 124 for providing power into the cavity. The length of the antenna is penetration into the cavity can be adjusted to enable better impedance matching to the cavity. Suitable adjustment allows-the reflected power to be low as a few percent.

A mirror 126 provided in the cavity enables a user monitoring the operation to observe the light emitted from the heated fibers along most of their length. The mirror can be a thin curved mirror as shown. Light reflected from the mirror passes through a re-imaging lens 128 located at the other end of the cavity. This image can be either directly watched or captured by a video camera 130 as shown, and then displayed on a monitor 132.

This optical system enables optimization of fiber positions and also allows continuous monitoring of the processing chamber.

A cross section of the device along the line A–A1 is shown in FIG. 2. The processing chamber is substantially cylindrical, having curved cavity wall 200. The fibers are located in slots 202 which are at substantially equal angular intervals, but at the same radial distance. The centers of these slots are preferably located about 3 mm from the wall. The TM010 mode that is used herein has an electric field with a node at the wall. Therefore, the fibers are located about 3 mm from the node.

Each of the slots 202 include a transparent quartz tube 102 that is supplied with reagent gas. The tube wall 210 is approximately 1 mm thick. The wall also has a varied diameter portion, including enlarged portion 140 which is approximately 6 mm in magnitude over most of the area inside the cavity. Portions 142, 144 are narrowed towards each end. The radial slots 202 enable adjustment of the radial position of the fiber in the cavity. This can optimize the location of the fiber and tube surrounding the fiber. In this way, the materials can be located in an optimum location for the desired heating effect.

According to a preferred mode, the optimized position produces a Q value which is high enough to maintain the integrity of the desired mode, while providing sufficient heat to the fibers as desired.

In operation, microwave energy is applied to the fibers in order to bring them to a specified temperature. That specified temperature can be visually determined—i.e., it is approximately when the fibers emit a bright yellow light for the materials described above. Then, the positions of the fibers are radially adjusted, as described above, to cause them to emit with substantially equal brightnesses along their lengths. The fibers near the end plates are in narrower chambers which provide less insulation of the fibers. Hence, these are cooler near those end plates.

The optical system described in summary above includes the curved glass mirror 126, the lens 128, video camera 130 and video monitor 132. This enables viewing the entire image of all of the fibers substantially simultaneously in order to determine the uniformity of the glowing fibers. Fine adjustments within the slots enable positioning the tubes for more even heating. In fact, the inventors found that even changing the position by as little as 1 mm can produce significant effects on the spatial distribution, color and brightness of the heated portions of the fibers. The inventors also found that it was easier to adjust the fibers when they are closer to the walls, and it is harder to adjust the positions of the fibers when they are farther from-the walls.

In addition, radial positions of the fibers that are near the cavity axis has relatively low Q values. This can produce a poor impedance match between the cavity, antenna and coaxial transmission line. The input power to the cavity was therefore limited, and the fibers were not easily heated to high-enough temperatures to allow CVD. Therefore this system prefers the positioning discussed above.

An alternative embodiment excites the cavity in a TM020 mode. In this TM020 mode, an electric field node is produced at a position that is about half the distance between the axis and the cavity wall. An important advantage of this embodiment is that larger diameter tubes can be used for the reaction chambers. This allows more reagent to be used, and also allows better insulation of the fibers. These larger diameter tubes can be positioned close to the cylindrical nodal surfaces. In this case, the Q of the cavity can be sufficiently high for good impedance matching even when many more fibers are in the cavity.

Use of larger tubes also reduces the rate at which reactant material is deposited on the tube wall. This permits longer processing intervals between cleaning operations.

This configuration also enables the walls of the reaction chamber to be further from the cavity walls. This increased separation reduces the additional but uneven heating of reaction chamber walls by reflected thermal radiation and by perturbations of the electric field at the reaction chamber walls closest to the cavity walls. Therefore, the rate of accumulation of reactant materials on the quartz walls is substantially lowered because of, inter alia, the lower wall temperatures of the reaction chambers.

Hence, it is preferred that even larger cavities could be used in the future to further reduce this.

An important feature of the techniques described above is that simultaneous processing of multiple fibers becomes possible. This can reduce the manpower to form the fibers, since multiple fibers can be coated in one operation. In addition, however, operating costs are reduced since approximately the same amount of power is used to coat multiple fibers, while in previous art that power was used to coat only a single fiber. In part, this higher efficiency is obtained by this system which better concentrates the microwave energy where it is needed, rather than on the cavity walls. Additional advantages are obtained by avoiding wasting power in a dummy load such as in a microwave waveguide applicator.

More efficient use of power is obtained by obtaining a good impedance match between the partially filled cavity and the antenna and transmission line that feeds it. The electric dipole rod antenna which is described herein extends into the cavity. This enables and facilitates adjustment provided that the fibers are properly positioned. With the preferred fibers which use lossy cores such as carbon, fiber positions are near an electric field node for the cylindrical TM0N0 node. The optimum radius is further from the node for less lossy fibers. Better uniformity is obtained when the fibers are distributed at equal angular intervals around the circle as preferred.

The slots which are used allow optimization by adjustment of the radial position of the fiber. Additional optimization to achieve uniformity in processing can be obtained by the flow meter and control valves and fluid lines as shown.

As described above, the proper selection of the radius of the tubes also provides certain advantages. Larger radii provide the unexpected advantage that reactant material is slower to accumulate on the surface of the tube. This enables less frequent cleaning. A preferred optimum value is approximately 2 to 3 mm. However, even larger tubes can be used where their dimension are compatible with the size of the device being considered.

Although only a few embodiments have been described in detail above, other modifications are within the following claims. For example, other materials could be used for the cores, and this system is not limited to lossy cores. Also, other microwave frequencies and other sizes could be used.

What is claimed is:

1. A method of heating a plurality of fibers, comprising:

providing said fibers in an environment which produces microwave energy that is substantially dependent only on radius within a cylindrical cavity;

observing said fibers, to determine a color thereof caused by the heating caused by the microwave;

adjusting a position of at least one of said fibers to make the color, and hence heating effect, more uniform; and carrying out an operation on the heated fibers.

* * * * *